United States Patent
Bruendel et al.

(10) Patent No.: US 8,835,222 B2
(45) Date of Patent: Sep. 16, 2014

(54) METHOD FOR PRODUCING A TWO-CHIP ASSEMBLY AND CORRESPONDING TWO-CHIP ASSEMBLY

(71) Applicants: Mathias Bruendel, Stuttgart (DE); Frieder Haag, Wannweil (DE); Jens Frey, Filderstadt (DE); Rolf Speicher, Tuebingen (DE); Juergen Fritz, Reutlingen (DE); Lutz Rauscher, Reutlingen (DE)

(72) Inventors: Mathias Bruendel, Stuttgart (DE); Frieder Haag, Wannweil (DE); Jens Frey, Filderstadt (DE); Rolf Speicher, Tuebingen (DE); Juergen Fritz, Reutlingen (DE); Lutz Rauscher, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 155 days.

(21) Appl. No.: 13/623,244

(22) Filed: Sep. 20, 2012

(65) Prior Publication Data
US 2013/0082406 A1 Apr. 4, 2013

(30) Foreign Application Priority Data
Sep. 29, 2011 (DE) .................... 10 2011 083 719

(51) Int. Cl.
| | | |
|---|---|---|
| *H01L 21/00* | (2006.01) | |
| *B81C 1/00* | (2006.01) | |
| *H01L 21/56* | (2006.01) | |
| *H01L 21/50* | (2006.01) | |
| *H01L 23/48* | (2006.01) | |
| *H01L 23/00* | (2006.01) | |
| *H01L 23/544* | (2006.01) | |
| *H01L 21/768* | (2006.01) | |

(52) U.S. Cl.
CPC ......... *H01L 23/48* (2013.01); *B81C 2203/0154* (2013.01); *H01L 2224/17181* (2013.01); *H01L 24/17* (2013.01); *H01L 24/81* (2013.01); *H01L 2224/16145* (2013.01); *H01L 24/13* (2013.01); *H01L 2224/13101* (2013.01); *B81C 1/00238* (2013.01); *B81B 2207/096* (2013.01); *B81B 2207/012* (2013.01); *H01L 2224/131* (2013.01); *H01L 2224/13025* (2013.01); *H01L 2224/94* (2013.01); *H01L 21/561* (2013.01); *H01L 2223/54466* (2013.01); *H01L 2924/01012* (2013.01); *H01L 2224/16146* (2013.01); *H01L 24/94* (2013.01); *H01L 2223/54426* (2013.01); *B81C 2203/0792* (2013.01); *H01L 2924/1461* (2013.01); *H01L 2224/09181* (2013.01); *H01L 2224/9202* (2013.01); *H01L 24/11* (2013.01); *H01L 23/544* (2013.01); *H01L 21/50* (2013.01); *H01L 24/92* (2013.01); *H01L 2224/97* (2013.01); *H01L 2924/1433* (2013.01); *H01L 24/97* (2013.01); *H01L 21/76898* (2013.01)
USPC .......................................... 438/108; 438/459

(58) Field of Classification Search
CPC ........................................................ H01L 24/94
USPC .................................................. 438/459, 108
See application file for complete search history.

(56) References Cited

U.S. PATENT DOCUMENTS

| | | |
|---|---|---|
| 7,446,405 B2 | 11/2008 | Kim et al. |
| 7,838,975 B2 | 11/2010 | Chen |
| 2011/0226299 A1* | 9/2011 | Makansi ................ 136/203 |
| 2013/0122672 A1* | 5/2013 | Or-Bach et al. ............ 438/199 |

* cited by examiner

*Primary Examiner* — Long K Tran
(74) *Attorney, Agent, or Firm* — Kenyon & Kenyon LLP

(57) ABSTRACT

A method for producing a two-chip assembly includes: providing a wafer having a first thickness, which wafer has a front side and a back side, a first plurality of first chips being provided on the front side of the wafer; attaching a second plurality of second chips on the front side of the wafer, so that every first chip is joined in each instance to a second chip and forms a corresponding two-chip pair; forming a cohesive mold package on the front side of the wafer, so that the second chips are packaged; thinning the wafer from the back side to a second thickness which is less than the first thickness; forming vias from the back side to the second chips; and separating the two-chip pairs into corresponding two-chip assemblies.

10 Claims, 3 Drawing Sheets

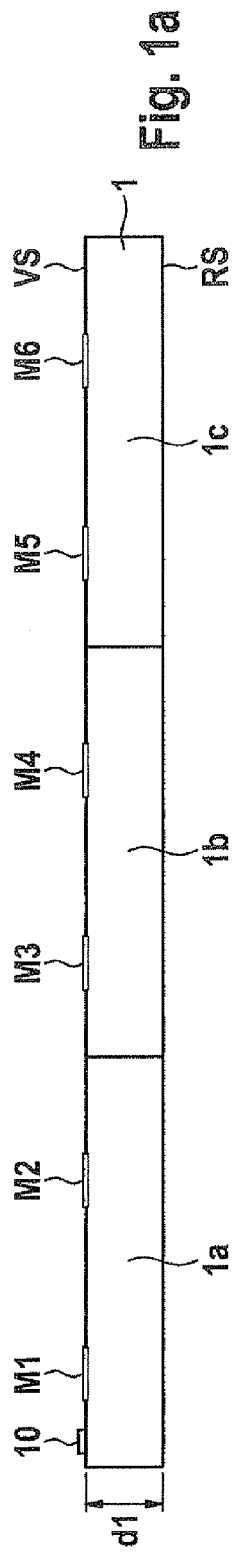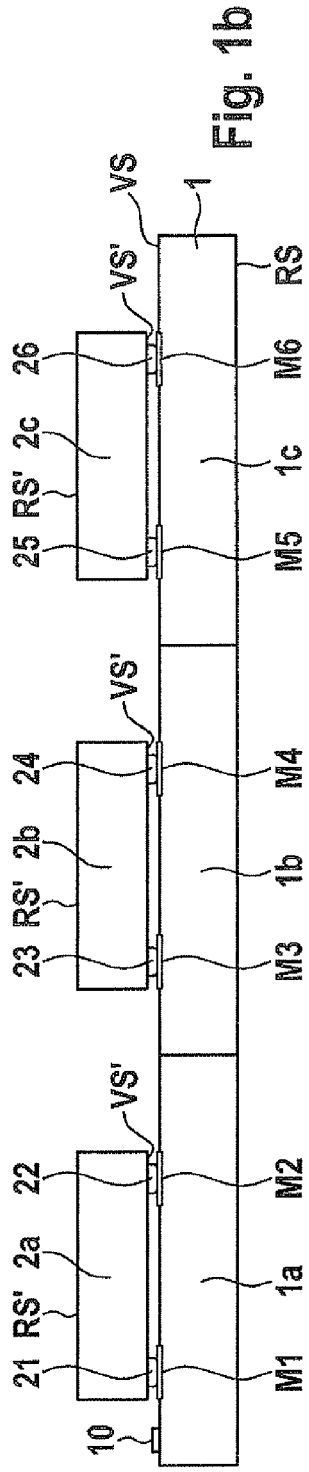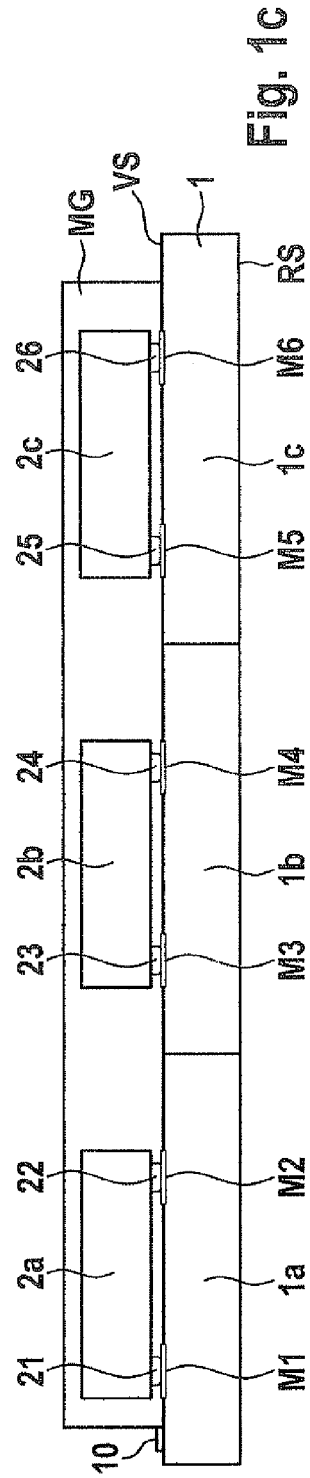

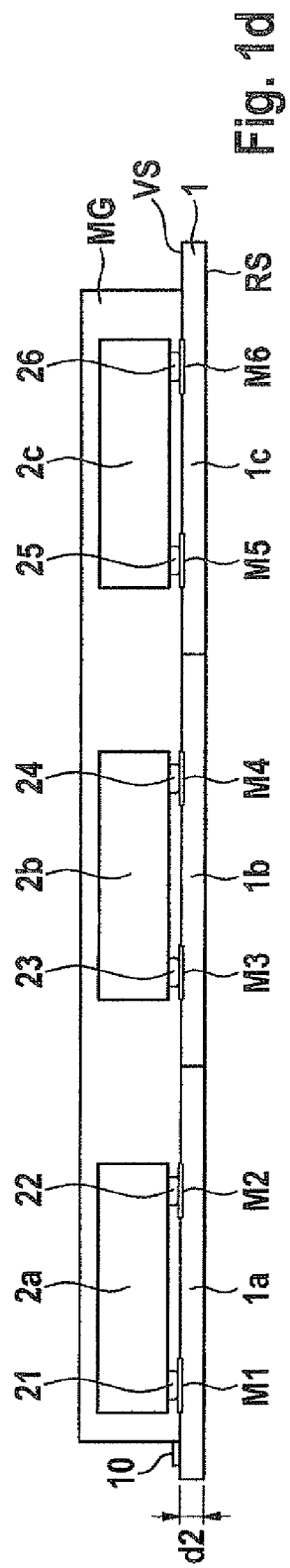
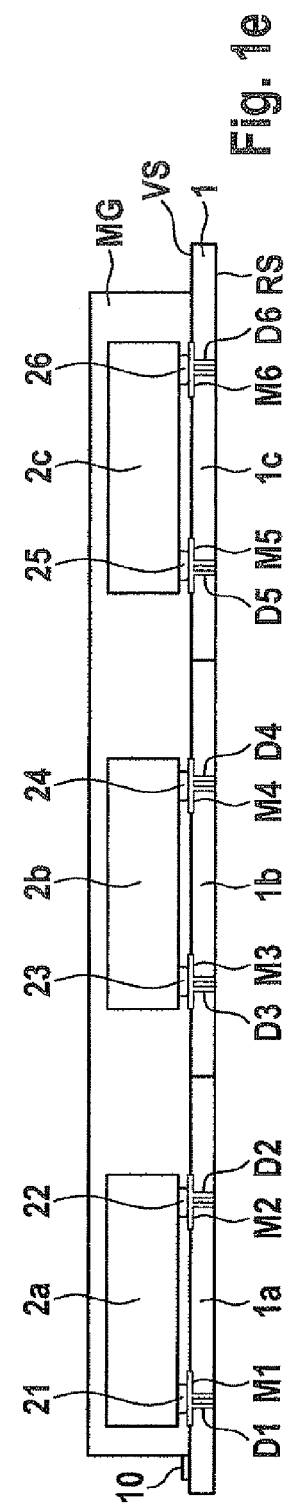
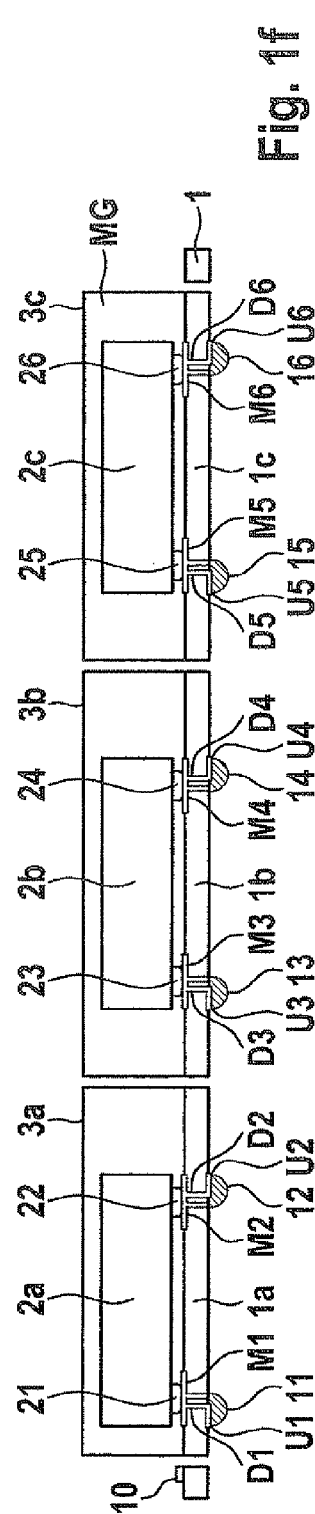

METHOD FOR PRODUCING A TWO-CHIP ASSEMBLY AND CORRESPONDING TWO-CHIP ASSEMBLY

BACKGROUND OF THE INVENTION

1. Field of the Invention

The present invention relates to a method for producing a two-chip assembly, and a corresponding two-chip assembly.

2. Description of the Related

Although any micromechanical or microelectronic components are also usable, the present invention and the problem underlying it are explained on the basis of micromechanical sensor devices.

These days, micromechanical sensor devices for consumer applications are packaged predominantly in QFN (Quad Flat No Leads)-, LGA (Land Grid Array)- or BGA (Ball Grid Array)-packages. In so doing, space is needed on the side for the formation of wire bonds. In the case of single chips, Wafer Level Packages (WLP), also known as Wafer-Level Chip-Size Packages (WL-CSP), are beginning to win favor.

The U.S. Pat. Nos. 7,838,975 and 7,446,405 describe Wafer-Level Chip-Size Packages.

BRIEF SUMMARY OF THE INVENTION

The present invention permits a robust production of a two-chip assembly as a chip-size package, because the back of the wafer is thinned and the vias are applied from the back side only after the cohesive one-sided mold package has been produced. Wafer breakage and reduced yield are able to be avoided by the procedure of the present invention.

BRIEF DESCRIPTION OF THE DRAWINGS

FIGS. 1a to 1g show schematic cross-sectional views for explaining a method for producing a two-chip assembly in the form of a micromechanical sensor device according to an example embodiment of the present invention.

DETAILED DESCRIPTION OF THE INVENTION

Figure 1G:
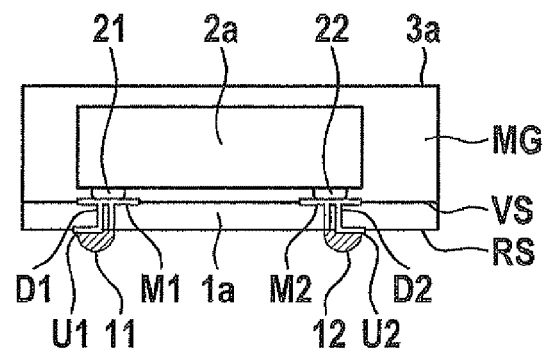

In the figures, identical reference symbols denote identical or functionally equivalent elements.

In FIG. 1a), reference numeral 1 denotes a silicon wafer having a front side VS and a back side RS. A plurality of first chips 1a, 1b, 1c, which are ASIC chips, is provided in silicon wafer 1. On front side VS, first chips 1a, 1b, 1c have pairs of first electrical connection areas M1, M2 and M3, M4 and M5, M6, respectively.

Reference numeral 10 denotes an alignment device, e.g., alignment marks or pattern, applied on front side VS of wafer 1.

Continuing with reference to FIG. 1b), a corresponding plurality of second chips 2a, 2b, 2c is mounted on front side VS of wafer 1 using customary processes, so that every first chip 1a, 1b, 1c is joined in each instance to a second chip 2a, 2b, 2c and forms a corresponding two-chip pair. During mounting, the pairs of first electrical connection areas M1, M2 and M3, M4 and M5, M6 are connected to corresponding pairs of second connection areas 21, 22 and 23, 24 and 25, 26, respectively, of second chips 2a, 2b, 2c.

In the present specific embodiment, second chips 2a, 2b, 2c, which in the present case are micromechanical sensor chips, are mounted using flip-chip technology, front side VS' of second chips 2a, 2b, 2c pointing toward front side VS of wafer 1, and back side RS' of second chips 2a, 2b, 2c facing away from it.

It is equally possible to bond chips 2a, 2b, 2c adhesively onto front side VS of wafer 1 and to contact them using wire bond connections.

Continuing with reference to FIG. 1c), a cohesive, one-sided mold package MG is subsequently formed on front side VS of wafer 1 in such a way that second chips 2a, 2b, 2c are packaged. This is accomplished in a customary injection molding process such as transfer molding or compression molding, or in a customary casting process. The molding stabilizes wafer 1 sufficiently for the following process steps. Preferably, during the molding-over process, the wafer edge is used for holding down in the tool, and thus is kept free of molding compound. Alignment device 10 is not molded over, since it is needed in the following process steps.

Continuing with reference to FIG. 1d), wafer 1 is then thinned by a grinding process starting from back side RS, in doing which, wafer 1 is backthinned from first thickness d1 to second thickness d2, typical values for d1 being between 600 μm and 800 μm, and for d2, being between 50 and 150 μm.

In the following process step, which is illustrated in FIG. 1e), vias D1, D2, D3, D4, D5, D6 to first electrical connection areas M1, M2, M3, M4, M5, M6 are formed starting from back side RS, in doing which, first connection areas M1 to M6 are used as stop surfaces. The vias are formed using customary lithographic etching technology.

In order to align vias D1 to D6 with the corresponding target structures on front side VS, alignment device 10 may be used, or alternatively or additionally, the front side may be viewed in reflection with infrared. In order for alignment device 10 to be visible in this step, mold package MG does not extend to alignment device 10.

Continuing with reference to FIG. 1f), after forming vias D1 to D6, third electrical connection areas U1 to U6 are formed on the back side and may also be provided with a wiring around (not shown); at the end, solder bumps 11, 12, 13, 14, 15, 16 are provided on third electrical connection areas U1 to U6. After that, the two-chip pairs, having chips 1a, 2a and 1b, 2b and 1c, 2c, respectively, are separated into corresponding two-chip assemblies.

FIG. 1g) shows the final product in the form of a two-chip assembly 3a having chips 1a, 2a.

What is claimed is:

1. A method for producing a two-chip assembly, comprising:
   providing a wafer having a first thickness, a front side, and a back side, a first plurality of first chips being provided as part of the wafer;
   mounting a second plurality of second chips on the front side of the wafer so that every first chip is joined in each instance to a corresponding second chip and forms a corresponding two-chip pair;
   forming a cohesive one-sided mold package on the front side of the wafer so that the second chips are packaged;
   thinning the wafer from the back side to a second thickness which is less than the first thickness;
   forming multiple vias and electrical connections from the back side to the second chips; and
   separating the two-chip pairs into corresponding two-chip assemblies.

2. The method as recited in claim 1, wherein:
   the first chips have first electrical connection areas on the front side of the wafer; and the first electrical connection areas are connected to corresponding second connection areas of the second chips upon mounting of the second plurality of second chips.

3. The method as recited in claim 2, wherein the first connection areas are used as stop surfaces when forming the vias.

4. The method as recited in claim 3, wherein the thinning of the wafer from the back side is accomplished by a grinding process.

5. The method as recited in claim 3, wherein the mold package is formed by one of an injection molding process or a casting process.

6. The method as recited in claim 3, wherein one selected partial area of the front side is (i) not provided with the mold package, and (ii) provided with an alignment device used for alignment when forming the vias.

7. The method as recited in claim 3, wherein after the forming of vias and prior to the separating of the two-chip pairs, third connection areas are formed on the back side.

8. The method as recited in claim 7, wherein solder bumps are formed on the third connection areas.

9. The method as recited in claim 7, wherein the second chips are mounted on the front side of the wafer using flip-chip technology.

10. The method as recited in claim 7, wherein the first chips are ASIC chips and the second chips are micromechanical sensor chips.

* * * * *